United States Patent [19]

Matsuda

[11] 4,248,948
[45] Feb. 3, 1981

[54] PHOTOMASK

[75] Inventor: Takashi Matsuda, Kasugai, Japan

[73] Assignee: Tokyo Shibaura Electric Co., Ltd., Japan

[21] Appl. No.: 782,069

[22] Filed: Mar. 28, 1977

[30] Foreign Application Priority Data

Mar. 30, 1976 [JP] Japan ................... 51-34829

[51] Int. Cl.³ .................... G03C 5/00; G03C 11/00
[52] U.S. Cl. ........................... 430/5; 29/579;
156/656; 428/209; 428/210; 428/433; 428/195;
430/11; 430/13; 430/16
[58] Field of Search ............ 428/195, 209, 210, 433;
156/656; 29/579; 96/38.3, 36.2

[56] References Cited

U.S. PATENT DOCUMENTS

| 3,118,788 | 1/1964 | Hensler | 428/210 |
| 3,753,816 | 8/1973 | Feldstein et al. | 156/656 |
| 3,758,326 | 9/1973 | Hennings et al. | 96/38.3 |
| 3,866,310 | 2/1975 | Driver et al. | 29/579 |
| 3,926,699 | 12/1975 | Dixon | 156/656 |
| 3,990,982 | 11/1976 | Dixon | 156/656 |
| 3,991,231 | 11/1976 | Trausch | 156/656 |
| 4,068,018 | 1/1978 | Hashimoto et al. | 96/38.3 |
| 4,113,486 | 9/1978 | Sato | 96/38.3 |

Primary Examiner—George F. Lesmes
Assistant Examiner—E. Rollins Buffalow
Attorney, Agent, or Firm—Finnegan, Henderson, Farabow, Garrett & Dunner

[57] ABSTRACT

A photomask comprising a substrate pervious to light having one or more transparent islands and one or more opaque islands formed on one surface thereof, the thickness of the transparent islands being greater than that of the opaque islands. When this photomask is used to pattern a photoresist, the gas evolved from the photoresist can be effectively led to the outside, so that the quality of contact between the semiconductor wafer and the photomask is improved.

5 Claims, 8 Drawing Figures

PHOTOMASK

BACKGROUND OF THE INVENTION

This invention relates to improvements in photomasks, especially hard masks, for use in photoetching.

Conventionally, the photoetching technique is employed in the fabrication of semiconductor integrated-circuit devices. In patterning the photoresist applied to a semiconductor substrate, a photomask is brought into contact with the photoresist and then exposed to ultraviolet light. Although various methods of exposure such as contact exposure and projection exposure are available, the contact exposure method is commonly employed from the viewpoint of resolving power and cost. The projection exposure method is only employed for special purposes. The prior art photomasks include emulsion masks provided with a mask layer having a thickness of several microns and what is called hard masks provided with a mask layer of metal oxide having a thickness of at most 3000 Å. For purposes of minute processing to a line width of 6μ or less, hard masks are largely employed from the viewpoint of resolving power and mask life.

Meanwhile, the photoresists commercially available for the fabrication of semiconductor integrated-circuit devices evolve nitrogen gas on exposure to ultraviolet light, whether they may be of the positive or negative type. According to the method of exposure in which a photomask is brought into close contact with a wafer under a pressure of, for example, 100 g/cm$^2$, the nitrogen gas so evolved accumulates between the photomask and the wafer, so that part of the photomask may go out of contact with the wafer and thereby cause a reduction in resolving power. In the case of a photomask of the emulsion type having a mask layer as thick as several microns, the nitrogen gas escapes to the outside through the grooves formed in the mask surface. Even if the nitrogen gas accummulates in the grooves, the pressure does not rise to such a degree as to degrade the quality of contact. Consequently, any reduction in resolving power due to poor contact does not occur. In the case of a hard mask, however, the grooves formed in the mask surface is so shallow that the nitrogen gas scarcely escapes therethrough and causes a reduction in resolving power due to poor contact. Since the elimination of such poor contact is essential for the purpose of increasing the yield of products, there has been a strong demand for proper countermeasures.

SUMMARY OF THE INVENTION

Accordingly, it is an object of this invention to provide a photomask which allows the gas evolved from the photoresist being patterned to be effectively led to the outside.

It is another object of this invention to provide a method of making such a photomask.

According to one aspect of the invention, there is provided a photomask comprising a substrate pervious to light having one or more transparent islands and one or more opaque islands formed on one surface thereof, the thickness of said transparent islands being greater than that of said opaque islands.

According to another aspect of the invention, there is provided a method of making a photomask which comprises the steps of depositing a photoresist selectively on one surface of a substrate pervious to light; digging down the exposed area of said surface of said substrate to a predetermined depth by etching with said photoresist utilized as a mask; forming a film impervious to light on the exposed area of said surface of said substrate and on the surface of said photoresist left on said substrate, the thickness of said film impervious to light being less than said predetermined depth; and removing said photoresist together with said film impervious to light formed on the surface thereof.

In addition, there is also provided another method of making a photomask which comprises the steps of forming a film pervious to light on one surface of a substrate pervious to light; depositing a photoresist selectively on said film pervious to light; removing said film pervious to light selectively by etching with said photoresist utilized as a mask, and thereby exposing said surface of said substrate selectively; forming a film impervious to light on the exposed area of said surface of said substrate and on the surface of said photoresist left on said substrate, said film impervious to light being thinner to said film pervious to light; and removing said photoresist together with said film impervious to light formed on the surface thereof.

Preferably, the film pervious to light in the form of one or more transparent islands is formed of silicate glass, silicon dioxide, PSG (phosphosilicate glass), or $Si_3N_4$. The film impervious to light in the form of one or more opaque islands may be formed of a metal or a metallic oxide. A preferred metal is chromium and a preferred metallic oxide is iron oxide or chromium oxide. The substrate pervious to light may be made of silicate glass. The thickness of the transparent islands is preferably from about 0.1μ to about 2.0μ, while the thickness of the opaque islands is preferably from about 0.06μ to about 0.3μ.

DESCRIPTION OF THE PREFERRED EMBODIMENT

The present invention will be better understood by referring to the following examples.

EXAMPLE 1

Figure 1A:
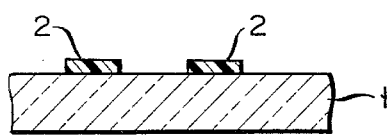
FIGS. 1(a)–1(d) are sectional views of an improved photomask illustrating one form of the method of this invention at successive stages.
Figure 1B:
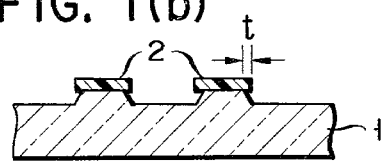
Figure 1C:
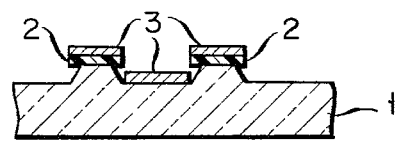
Figure 1D:
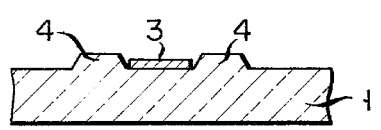

Referring now to FIG. 1, a pattern consisting of a resist film 2 of desired configuration was formed on the top surface of a silicate glass substrate 1 by the photoetching process (FIG. 1(a)). Utilizing the resist film 2 as a mask, the substrate 1 was etched with ammonium fluoride (NH$_4$F) to a depth of 1.5μ (FIG. 1(b)). As a result, the substrate 1 beneath the resist film 2 was laterally overetched by a distance (t) of about 2μ. Then, while the resist film 2 was left as it was, a chrome layer 3 of about 600 Å (0.06μ) thickness was formed by vacuum deposition or sputtering (FIG. 1(c)). Thereafter, the resist film 2 was stripped off to remove the chrome layer 3 formed thereon and thereby obtain a photomask (FIG. 1(d)). This photomask comprised the substrate 1 having one or more transparent islands and one or more opaque islands formed on the top surface thereof, the transparent islands consisting of a silicate glass layer 4 of 1.5μ thickness and the opaque islands 3 consisting of a chrome layer 3 of 0.06μ thickness. The above-mentioned overetching of the substrate 1 was done in order to positively prevent the chrome layer 3 formed on the exposed area of the top surface of substrate 1 and the chrome layer 3 formed on the resist film 2 from being united with each other and thereby facilitate removal of the resist film 2 together with the chrome layer 3 formed thereon.

The use of the so obtained photomask in the manufacture of a semiconductor device will now be described below.

The photomask thus obtained was brought into close contact with the photoresist film formed on one surface of a semiconductor wafer, the transparent and opaque islands facing the photoresist film. Then, the photoresist film was patterned by exposure to ultraviolet light thrown from above the photomask. As a result, the nitrogen gas evolved from the photoresist film was effectively led to the outside through the spaces formed between the transparent and opaque islands. Thus, the yield was found to increase by about 10% when the above-mentioned photomask was used to fabricate integrated-circuit devices. The greater the thickness of the transparent islands of such a photomask is, the more effectively will the nitrogen gas be led to the outside. However, too thick transparent islands tends to decrease the accuracy in patterning a photoresist because of the effect of diffraction of light.

EXAMPLE 2

Figure 2A:
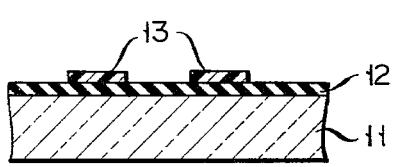
FIGS. 2(a)–2(d) are sectional views of another improved photomask illustrating a modified form of the method of this invention at successive stages.
Figure 2B:
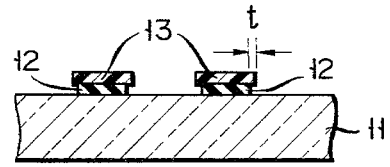
Figure 2C:
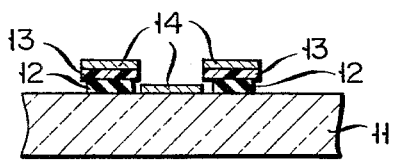
Figure 2D:
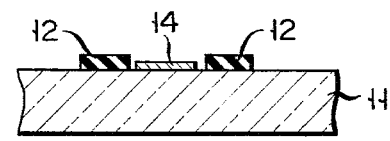

Referring now to FIG. 2, a silicon dioxide film 12 of 1.2μ thickness was deposited on the top surface of a silicate glass substrate 11 by thermally decomposing monisilane ($SiH_4$) at 500° C. in an atmosphere of oxygen, and a pattern consisting of a resist film 13 of desired configuration was formed thereon by the conventional photoetching process (FIG. 2(a)). Then, the exposed area of the silicon dioxide film 12 was etched away with ammonium fluoride ($NH_4F$). Since the accuracy of this mask was not determined by the dimensions of the remaining silicon dioxide film 12, it was laterally overetched by a distance of 1.5μ (FIG. 2(b)). This distance is represented by (t) in the figure. Then, while the resist film 13 was left as it was, a chrome layer 14 of about 1000 Å thickness was formed by vacuum deposition or sputtering (FIG. 2(c)). Thereafter, the resist film 13 was stripped off to remove the chrome layer 14 formed thereon and thereby obtain a photomask (FIG. 2(d)).

The photomask thus obtained was used in the same manner as in Example 1 to fabricate integrated-circuit devices. As a result, the yield was found to increase by about 8%.

What is claimed is:

1. A photomask to pattern a photoresist of a semiconductor during fabrication of a semiconductor device, said photomask being placed to face said photoresist and being exposed to light, said photomask comprising a substrate pervious to light and means for elimination of gas generated during said exposure to light, said means including one or more transparent islands formed on and projecting from one surface of the substrate, and one or more opaque islands formed on and projecting from the same surface of the substrate spaced from the transparent islands, the thickness of said transparent islands being greater than that of said opaque islands, said transparent islands being formed of silicate glass, silicon dioxide, phosphosilicate glass, or trisilicon tetranitride, and said opaque islands being formed of a metal or a metal oxide.

2. A photomask as claimed in claim 1 wherein said metal is chromium and said metallic oxide is one kind selected from the group consisting of iron oxide and chromium oxide.

3. A photomask as claimed in claim 1 wherein the thickness of said transparent islands is from about 0.1μ to about 2.0μ.

4. A photomask as claimed in claim 1 wherein the thickness of said opaque islands is from about 0.06μ to about 0.3μ.

5. A photomask as claimed in claim 1 wherein said substrate pervious to light is made of silicate glass.

* * * * *